United States Patent
Suzuki

(10) Patent No.: US 7,640,887 B2
(45) Date of Patent: Jan. 5, 2010

(54) SURFACE WAVE EXCITATION PLASMA GENERATOR AND SURFACE WAVE EXCITATION PLASMA PROCESSING APPARATUS

(75) Inventor: Masayasu Suzuki, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 360 days.

(21) Appl. No.: 11/815,755

(22) PCT Filed: Apr. 20, 2006

(86) PCT No.: PCT/JP2006/308329

§ 371 (c)(1),
(2), (4) Date: Aug. 7, 2007

(87) PCT Pub. No.: WO2006/118042

PCT Pub. Date: Nov. 9, 2006

(65) Prior Publication Data
US 2009/0026963 A1  Jan. 29, 2009

(30) Foreign Application Priority Data
Apr. 26, 2005 (JP) ............................. 2005-128079

(51) Int. Cl.
*C23C 16/00* (2006.01)
(52) U.S. Cl. ................. 118/723 MW; 118/723 AN; 219/121.36; 219/690; 315/111.21; 315/39; 343/771; 343/770
(58) Field of Classification Search ............ 315/111.21, 315/111.41, 39, 34; 118/723 MW, 723 MR, 118/723 ME, 723 MA, 723 AN; 219/121.36, 219/121.43, 690, 691; 343/767, 770, 771; 156/345.41
See application file for complete search history.

(56) References Cited

U.S. PATENT DOCUMENTS

| 6,497,783 B1 * | 12/2002 | Suzuki et al. ............ 156/345.1 |
| 6,652,709 B1 * | 11/2003 | Suzuki et al. .......... 156/345.41 |
| 7,023,393 B2 * | 4/2006 | Ishii et al. .................... 343/771 |
| 2007/0045244 A1 * | 3/2007 | Lee et al. ................ 219/121.43 |

FOREIGN PATENT DOCUMENTS

JP   05-345982   12/1993

* cited by examiner

*Primary Examiner*—Haissa Philogene
(74) *Attorney, Agent, or Firm*—J. C. Patents

(57) ABSTRACT

The present invention provides a surface wave excitation plasma generator in which surface wave excitation plasma is efficiently generated. A surface wave excitation plasma generator including an annular waveguide and a dielectric tube is provided. The annular waveguide 2 includes an inlet 2a for introducing a microwave M, an end plate 2b for reflecting the microwave M introduced and propagating within the waveguide, and a bottom plate 2c on which slot antennas 2d are formed at a predetermined interval. When the wavelength of the microwave M in the waveguide is $\lambda g$, the length from position b through positions c, d, e to position f on the bottom plate 2c, i.e. the circumferential length ($\pi \times D1$) of the annular waveguide, is set as 2 $\lambda g$, and the positions b, c, d, e, f are spaced apart at an interval of $\lambda g/2$. Since the slot antennas 2d are arranged at two positions c and e, the interval between these two slot antennas 2d is equal to the wavelength $\lambda g$ in the waveguide.

8 Claims, 6 Drawing Sheets

SURFACE WAVE EXCITATION PLASMA GENERATOR AND SURFACE WAVE EXCITATION PLASMA PROCESSING APPARATUS

CROSS-REFERENCE TO RELATED APPLICATION

This application claims the priority benefit of Japanese application serial no. 2005-128079, filed Apr. 26, 2005. All disclosure of the Japanese application is incorporated herein by reference.

BACKGROUND OF THE INVENTION

1. Field of the Invention

The present invention relates to a surface wave excitation plasma generator for generating surface wave excitation plasma by introducing microwave from a microwave generator, and a surface wave excitation plasma processing apparatus for performing chemical vapor deposition (CVD) or etching by utilizing the surface wave excitation plasma.

2. Description of Related Art

Surface wave plasma (SWP) is generated through the following ways. A microwave propagating in a microwave waveguide is introduced into a dielectric member through a slot antenna, and the plasma is excited by a surface wave generated on the surface of the dielectric member due to the microwave power to generate surface wave excitation plasma. For this kind of microwave waveguides, annular waveguides without ends but having a plurality of slot antennas disposed on the bottom plate thereof are already known in the art (for example, with reference to Patent Document 1).

Patent Document 1: Japanese Patent Laid-Open Publication No. H05-345982 (Page 2, FIGS. 6 and 9).

Since the annular waveguide without ends disclosed in Patent Document 1 includes no end parts, the microwave propagating in the waveguide is disturbed; thus, a stable standing wave cannot be formed, and the phase of the standing wave and the relative positions between slot antennas become unfixed, so that the microwave power is focused on a specific slot antenna. Accordingly, the surface wave excitation plasma has a problem of low yield.

SUMMARY OF THE INVENTION (1) The surface wave excitation plasma generator of the present invention is characterized in including a microwave generator, an annular microwave waveguide, and a cylinder-shaped dielectric member, in which if the wavelength in the waveguide of the microwave is $\lambda g$, and the constant k is in the range of $0.95\lambda g \sim \lambda g$, the circumferential length of the inner surface of the bottom plate is set as an integral multiple of the constant k. The annular microwave waveguide includes an inlet part for introducing microwave from the microwave generator, a fixed end part, and a bottom plate which serves as an inner surface and includes one slot antenna formed thereon or a plurality of slot antennas disposed thereon with a predetermined interval there-between. The cylinder-shaped dielectric part is in a shape of cylinder and has an outer surface being connected with the bottom plate of the annular microwave waveguide. The microwave propagating in the annular microwave waveguide is introduced into the cylinder-shaped dielectric member through the slot antenna, and the surface wave formed on the surface is used to generate surface wave excitation plasma.

(2) The present invention is also characterized in that, in the above-mentioned surface wave excitation plasma generator, the predetermined interval of the plurality of slot antennas is set as an integral multiple of the constant k.

(3) The present invention is also characterized in that, in the above-mentioned surface wave excitation plasma generator, the distance between the end part and the slot antenna disposed in front of the end part is set as an integral multiple of ½ of the constant k.

(4) The surface wave excitation plasma generator of the present invention is further characterized in including a microwave generator, an annular microwave waveguide, and a cylinder-shaped dielectric part. If the wavelength of the surface wave propagating in the inner peripheral surface of the cylinder-shaped dielectric part is $\lambda s$, and the constant s is in the range of $0.95\lambda s \sim \lambda s$, the circumferential length of the inner surface of the cylinder-shaped dielectric part is set as an integral multiple of the constant s. The annular microwave waveguide includes an inlet part for introducing microwave from the microwave generator, a fixed end part, and a bottom plate which serves as an inner surface and includes one slot antenna formed thereon or a plurality of slot antennas disposed thereon with a predetermined interval there-between. The cylinder-shaped dielectric member is cylindrical shape, and has an outer surface being connected with the bottom plate of the annular microwave waveguide. The microwave propagating in the annular microwave waveguide is introduced into the cylinder-shaped dielectric member through the slot antenna, and the surface wave formed on the surface is used to generate surface wave excitation plasma.

(5) The present invention is further characterized in that, in the above-mentioned surface wave excitation plasma generator, a mechanism for inserting/releasing a discharging-assistant part made of carbon or silicon carbide for assisting the discharge is disposed within an inner space of the cylinder-shaped dielectric member.

(6) The surface wave excitation plasma processing apparatus of the present invention is further characterized in including the above-mentioned surface wave excitation plasma generator, and a treatment chamber, wherein the treatment chamber is used to hold the cylinder-shaped dielectric part, so as to form an air-tight space, and a to-be-treated article is treated with the plasma generated by the surface wave excitation plasma generator.

EFFECT OF THE INVENTION

According to the present invention, the construction and size of the annular microwave waveguide having an end part can be optimized with respect to the wavelength in the waveguide of the microwave; thus, a surface wave excitation plasma can be effectively generated.

In order to make the aforementioned and other objects, features, and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Hereinafter, referring to FIGS. 1-6, a surface wave excitation plasma generator (hereinafter referred to as an SWP generator) and a surface wave excitation plasma processing apparatus (hereinafter referred to as a SWP processing apparatus) are illustrated according to embodiments of the present invention.

First Embodiment

Figure 1:
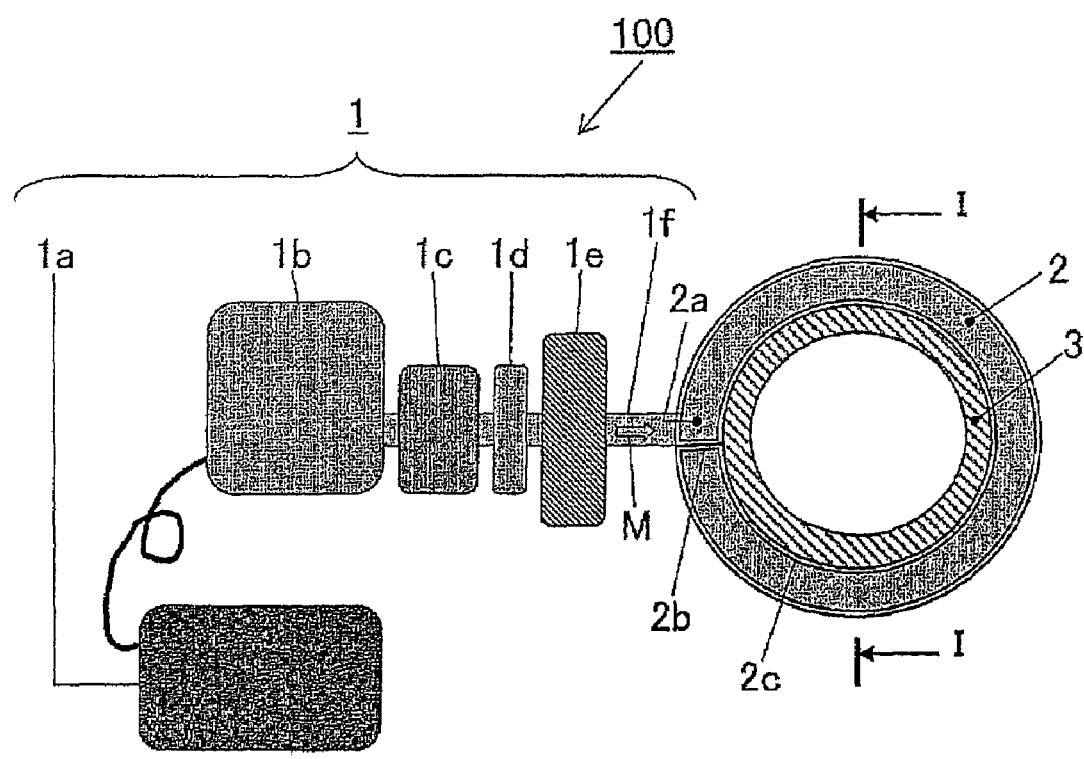
FIG. 1 is a schematic view of an overall structure of a surface wave excitation plasma generator (SWP) processing apparatus according to a first embodiment of the present invention.
Figure 2:
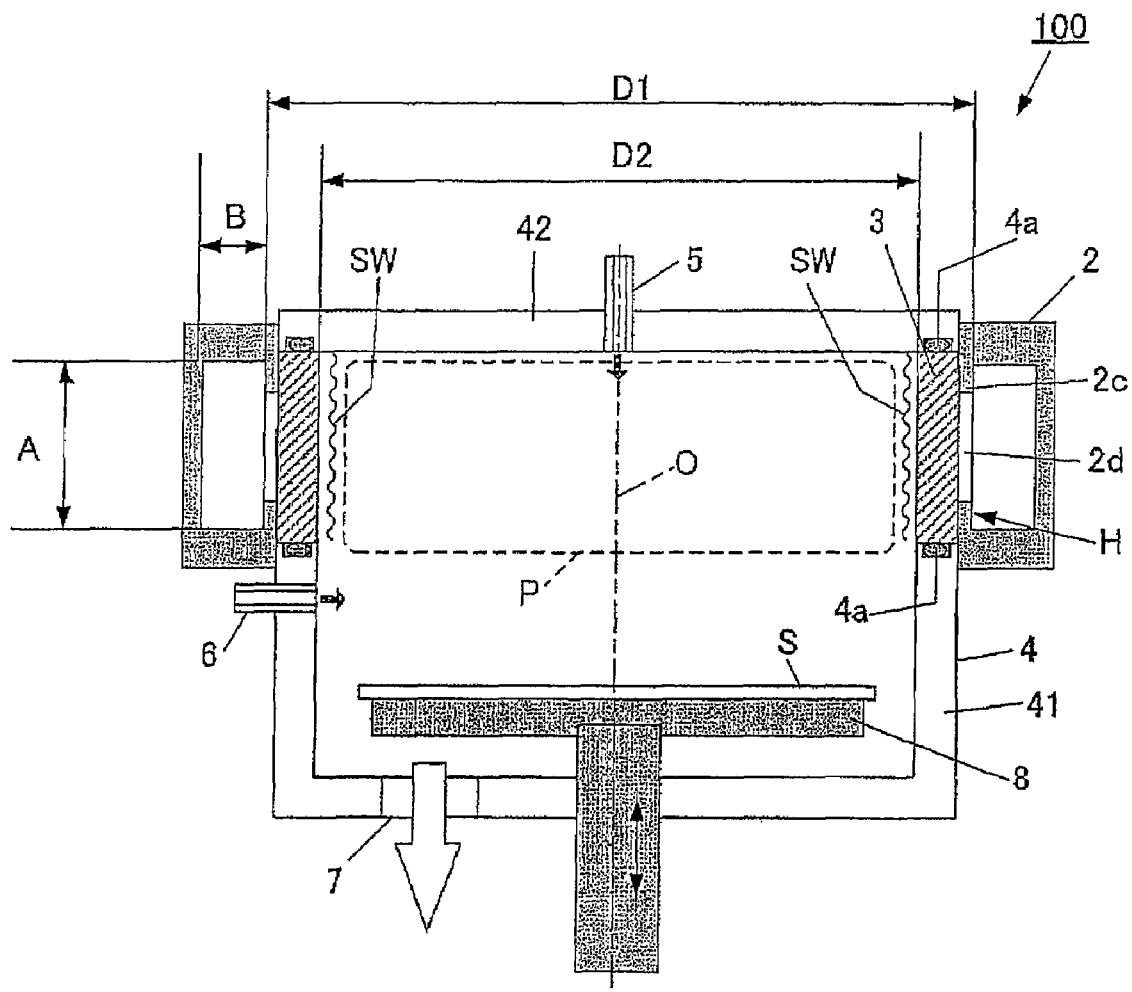
FIG. 2 is a cross-sectional view of the main parts of the SWP processing apparatus in FIG. 1 along a line of I-I.
Figure 3:
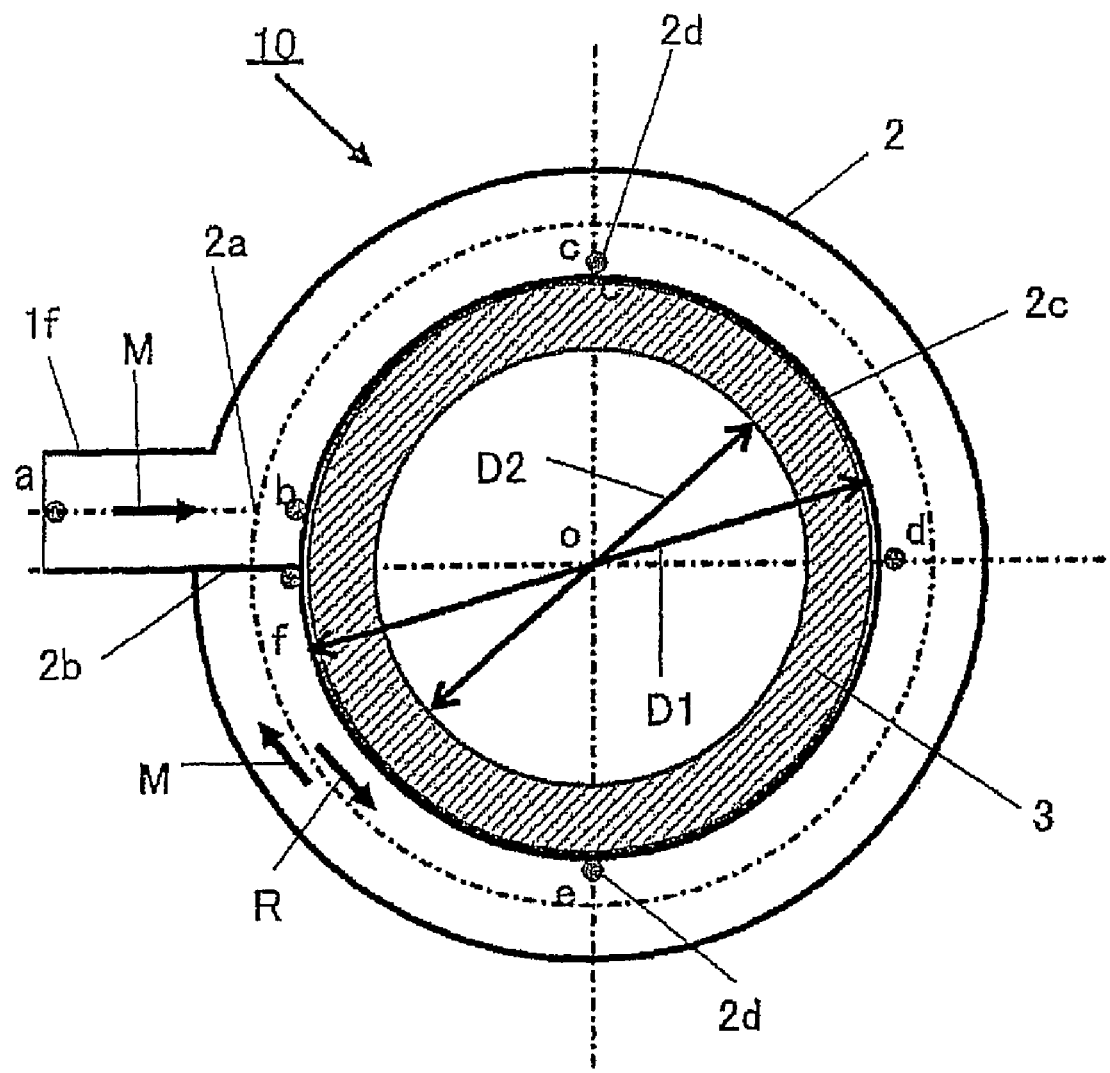
FIG. 3 is a horizontal cross-sectional view of the main parts of the SWP processing apparatus according to the first embodiment of the present invention.

FIG. 1 is a schematic view of an overall structure of a SWP processing apparatus according to a first embodiment of the present invention. FIG. 2 is a cross-sectional view of the main parts of the SWP processing apparatus in FIG. 1 along the line of I-I. FIG. 3 is a horizontal cross-sectional view of the main parts of the SWP processing apparatus in FIG. 1.

Referring to FIGS. 1 and 2, the structure of the SWP processing apparatus 100 includes a SWP generator 10 and a plasma treatment chamber 4. The SWP generator 10 includes a microwave generator 1, an annular waveguide 2, and a dielectric tube 3. The annular waveguide 2 is connected with the microwave generator 1, and the dielectric tube 3 is disposed at an inner side of the annular waveguide 2. In the plasma treatment chamber 4, an upper surface gas inlet pipe 5, a side surface gas inlet pipe 6, a gas outlet 7, and a substrate holder 8 are disposed, wherein the upper surface gas inlet pipe 5 is used for introducing a process gas from the upper surface; the side surface gas inlet pipe 6 is used for introducing a material gas or a process gas from the side surface; the gas outlet 7 is connected with a vacuum pump (not shown) through piping; and the substrate holder 8 is used for holding the substrate S to be treated. Such a SWP generator 10 can generate surface wave excitation plasma (SWP) in the plasma treatment chamber 4.

The microwave generator 1 includes a microwave power supply 1a, a microwave oscillator 1b, an isolator 1c, a directional coupler 1d, an assembly part 1e, and a connection pipe 1f. The microwave generator 1 can generate, for example, a microwave M of 2.45 GHz, and send the microwave M into the annular waveguide 2 through the connection pipe 1f.

The annular waveguide 2 is made of, for example, aluminum alloy or nonmagnetic stainless steel, and includes an inlet 2a for introducing microwave M, and an end plate 2b for reflecting the microwave M that is being introduced and propagated in the waveguide, and the annular waveguide 2 with a configuration having one end being sealed by the end plate 2b. As shown in FIG. 2, the cross-section of the annular waveguide 2 is hollow rectangular shape, and the bottom plate 2c of annular waveguide 2 serves as the inner peripheral side. The bottom plate 2c has one slot antenna 2d formed thereon or a plurality of slot antennas 2d disposed thereon with a predetermined interval there-between. The slot antennas 2d penetrate through the bottom plate 2c and form, for example, rectangular-shaped openings. Additionally, the inner surface (H surface) of the bottom plate 2c is referred to as a magnetic boundary.

The dielectric tube 3 is made of quartz or alumina, and installed within the plasma treatment chamber 4 in such a way that the two ends of the dielectric tube 3 pass through O-rings 4a. Moreover, an outer surface of the dielectric tube 3 is connected with the bottom plate 2c of the annular waveguide 2. With this configuration, an air-tight space is formed in the plasma treatment chamber 4. As shown in FIG. 2, in this embodiment, the plasma treatment chamber 4 includes a trough-shaped body 41 and a cover body 42, wherein the trough-shaped body 41 carries a dielectric tube 3 on the upper surface, and the cover body 42 is used for sealing the upper surface of the dielectric tube 3.

In the plasma treatment chamber 4, the surface wave excitation plasma P can be generated through the following ways. Firstly, the air in the chamber is pumped out to form a high vacuum. Next, a process gas, such as nitrogen, hydrogen, oxygen, and argon gas, or a material gas, such as $SiH_4$ gas, $Si_2H_6$ gas and TEOS gas, is introduced into the chamber through the upper surface gas inlet pipe 5 and the side surface gas inlet pipe 6. The gas is discharged via the gas outlet 7 while the gas is introduced into the chamber to maintain a predetermined gas pressure in the plasma treatment chamber 4. Under the conditions of a predetermined type of gas and gas pressure, microwave power is introduced into the dielectric tube 3 from the annular waveguide 2 through the slot antennas 2d. Plasma P is generated within the inner space of the dielectric tube 4 by utilizing the energy of the surface wave SW propagating in the inner peripheral surface of the dielectric tube 3. The gas in the plasma treatment chamber 4 is ionized and dissociated by utilizing the surface wave excitation plasma to perform plasma treatments, such as film formation, etching, and ashing.

Referring to FIGS. 2 and 3, the size of each part for the annular waveguide 2 and the dielectric tube 3 is illustrated below. Hereinafter, for simplicity, the annular waveguide 2 and the dielectric tube 3 are concentric cylinders, and the center of the cylinders is depicted as O. D1 is the diameter of the inner surface (H surface) of the bottom plate 2c of the annular waveguide 2, and the circumferential length of the inner surface of the bottom plate 2c is ($\pi \times D1$). The inner size of the annular waveguide 2 is ($A \times B$). D2 is the diameter of the inner peripheral surface of the dielectric tube 3, and the circumferential length of the inner peripheral surface is ($\pi \times D2$).

As shown in FIG. 3, the position "a" indicates a base point in the connection pipe 1f of the microwave generator 1, the positions b, c, d, e, and f are located on the bottom plate 2c of the annular waveguide 2, the position b corresponds to the inlet 2a of the microwave M, the position f corresponds to the end plate 2b. The length from the position b through the positions c, d, and e to the position f is the circumferential length ($\pi \times D1$) of the inner surface of the bottom plate 2c. The position b is a corner part of the annular waveguide 2, which is equivalent to the position f, for equally dividing the circumferential length (π×D1) into four quarters, so as to distribute the positions b, c, d, e, and f.

The microwave M forms a standing wave in the annular waveguide 2, which is irradiated into the dielectric tube 3 through the slot antennas 2d disposed on the bottom plate 2c during the propagating process, and the annular waveguide 2 forms a terminal part on the end plate 2b.

Figure 4:
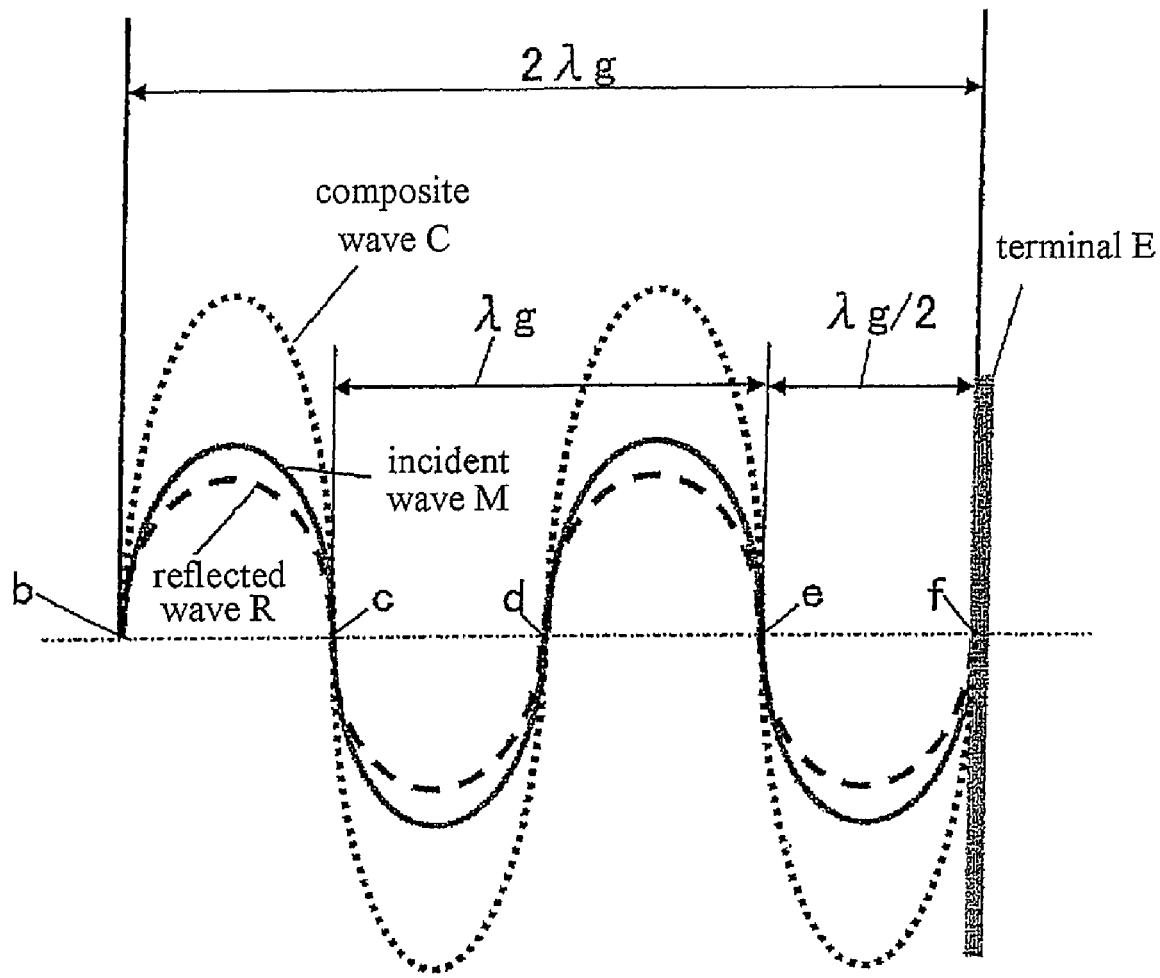
FIG. 4 is a schematic graphic view of an interference state between an incident wave M and a reflected wave R of the microwave in the SWP processing apparatus according to the first embodiment of the present invention.

FIG. 4 is a schematic graphic view of an interference state between an incident wave M and a reflected wave R in the electrical field distribution of the microwave. As shown in FIG. 4, the incident wave M travels from left to right and is reflected at the terminal E to form a reflected wave R. The reflected wave R travels from right to left. A composite wave C is generated by synthesizing the incident wave M with the reflected wave R.

The positions b, c, d, e, and f in FIG. 4 respectively correspond to each of the positions b, c, d, e, and f in the annular waveguide 2 in FIG. 3. If the wavelength of the microwave propagating in the annular waveguide 2 (the wavelength in waveguide) is set as λg, the length from the position b through the positions c, d, e to the position f on the bottom plate 2c is set as 2 λg. In other words, if the circumferential length (π×D1) of the annular waveguide 2 is set as 2 λg, an interval between the positions b, c, d, e, f is λg/2.

In fact, when the constant k is in the range of 0.95λg~λg, the circumferential length (π×D1) of the annular waveguide 2 is set as an integral multiple of the constant k. Herein, the constant k is a value obtained through experiments. Generally, if n is set as a positive integer, and (π×D1) is set to be equal to (n×k), the state of the standing wave in the annular waveguide 2 maintains stable, and the slot antennas 2d can be positioned.

Referring to FIGS. 3 and 4, the positions of the slot antennas 2d are illustrated. Corresponding to the wavelength and phase of the standing wave, the slot antennas 2d are disposed at two positions c and e. The interval between the two slot antennas 2d is equal to the wavelength in waveguide λg. Generally, the interval between the slot antennas 2d is set as an integral multiple of the constant k. Furthermore, the distance between the terminal E and the slot antenna 2d at the position e is equal to λg/2. Generally, the distance between the end plate 2b and the slot antenna 2d adjacent to the end plate 2b is set as an integral multiple of ½ of the constant k to form the standing wave of the microwave M by utilizing the end plate 2b. In this way, the slot antennas 2d can be disposed corresponding to the wavelength and phase of the standing wave of the microwave M.

In practical application, for example, if the inner size (A×B in FIG. 2) of the cross-section of the annular waveguide 2 is 109.2×54.6 mm, the wavelength λg in the waveguide is 147.9 mm. Accordingly, if n=2, the circumferential length (π×D1) of the annular waveguide 2 is 295.8 mm. Therefore, it is feasible merely to set D1 as 94.2 mm and to set the interval of the slot antennas 2d as λg (=147.9 mm). The wavelength in waveguide λg can be calculated through Equation 1, $$\lambda g = \lambda / \sqrt{\{1-(\lambda/\lambda c)^2\}} \quad (1),$$

in which λ is a free-space wavelength of the microwave M, λc is a cut-off wavelength, and λc=2A.

If the inner size of the cross-section of the annular waveguide 2 is 96×27 mm, the wavelength λg in waveguide is 158.8 mm. Therefore, as described above, it is feasible merely to set the circumferential length (λ×D1) and the interval of the slot antennas 2d. Certainly, if n is a positive integer, n is not limited to be 2.

The SWP generator 10 according to the first embodiment can have the following effects. The standing wave is formed by setting the circumferential length (λ×D1) of the annular waveguide 2 having the end plate 2b as an integral multiple of the constant k, and the slot antennas 2d are provided to effectively achieve their effects by means of setting the interval between the slot antennas 2d as an integral multiple of the constant k and setting the distance between the end plate 2b and the slot antenna 2d adjacent to the end plate 2b as an integral multiple of ½ of the constant k. Hence, the microwave power is emitted from the dielectric tube 3. As a result, a stable surface wave excitation plasma P can be effectively generated.

Furthermore, in the SWP processing apparatus 100, the stable surface wave excitation plasma P can be used to perform the treatment.

Figure 5:
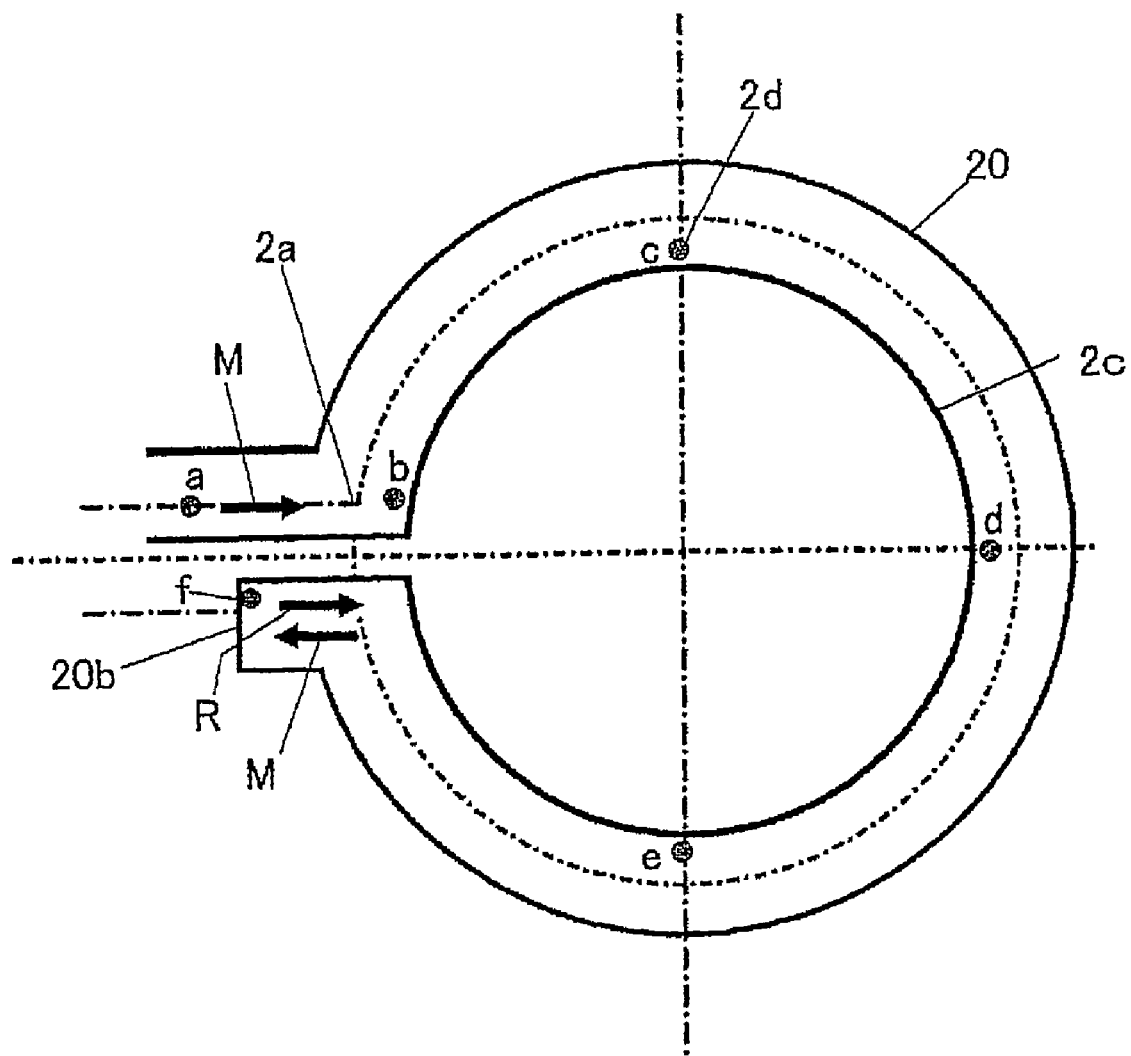
FIG. 5 is a schematic plan view of a varying embodiment of an annular waveguide used in the SWP generator and the SWP processing apparatus according to the first embodiment of the present invention.

FIG. 5 is a schematic plan view of a varying embodiment of an annular waveguide used in the SWP generator 10 and the SWP processing apparatus 100 according to the first embodiment of the present invention. The difference between the annular waveguide 20 in FIG. 5 and the annular waveguide 2 in FIG. 3 merely lies in that an end plate 20b located at the position f is disposed at an outer side of the annular part. However, the length from the position b through the positions c, d, and e to the position f, or the arrangement and the interval for the slot antennas 2d are all the same. When the position of the end plate 20b is alterable, the shape of the annular waveguide 20 changes correspondingly.

Second Embodiment

In the first embodiment, the circumferential length of the annular waveguide 2 and the position of the slot antennas 2d are optimized with respect to the wavelength λg (or the constant k) in waveguide. In the second embodiment, the circumferential length of the inner surface of the dielectric tube 3 is optimized with respect to the wavelength of the surface wave SW propagating on the dielectric surface. Therefore, the basic structures of the SWP generator 10 and the SWP processing apparatus 100 in the second embodiment are the same as those in the first embodiment; Thus, in order to avoid being redundant, merely the differences with respect to the first embodiment are illustrated.

As described above, when the microwave M is introduced into the dielectric tube 3 from the annular waveguide 2 through the slot antennas 2d, the plasma P is generated within the inner space of the dielectric tube 3 by utilizing the energy of the surface wave SW formed on the inner peripheral surface of the dielectric tube 3. The surface wave SW propagates on the inner peripheral surface of the dielectric tube 3 and is diffused to the whole inner peripheral surface. Generally, the wavelength λs of the surface wave SW propagating on the dielectric surface can be determined as $\lambda s = \lambda g / \sqrt{\in}$, by utilizing the wavelength λg in the waveguide of the microwave M and the dielectric constant ∈ of the dielectric member.

As for the size of each part of the dielectric tube 3, as shown in FIGS. 2 and 3, D2 is the diameter of the inner peripheral surface of the dielectric tube 3, and the circumferential length of the inner peripheral surface is (π×D2). In this embodiment, the circumferential length (π×D2) is set as an integral multiple of the wavelength λs of the surface wave SW. In fact, when the constant s is in the range of 0.95λs~λs, the circumferential length (π×D2) of the inner peripheral surface of the dielectric tube 3 is set as an integral multiple of the constant s. Herein, the constant s is a value obtained through experiments. Generally, if n is set as a positive integer, (π×D2) is set to be equal to (n×s). Accordingly, even if the surface wave SW propagating around the inner peripheral surface of the dielectric tube 3 generates interference, the surface wave SW is not attenuated. As a result, the surface wave excitation plasma P can be generated by effectively utilizing the energy of the surface wave; thus, the space homogeneity of the plasma P can be increased.

In practical application, for example, if the wavelength $\lambda g$ in waveguide of the annular waveguide 2 is 147.9 mm and the dielectric constant $\in$ of the dielectric tube 3 made of alumina is 10, the wavelength $\lambda s$ of the surface wave SW is 46.6 mm. Therefore, if the inner diameter D2 of the dielectric tube 3 is set as 59.3 mm, the circumferential length ($\pi \times D2$) is set as 186.4 mm and n=4 (an integer), the attenuation of the surface wave SW can be prevented. Furthermore, if the dielectric tube 3 is made of quartz, the inner diameter D2 and the circumferential length ($\pi \times D2$) of the dielectric tube 3 can be calculated through the same calculation method by utilizing the dielectric constant thereof as 3.5.

The SWP generator 10 in the second embodiment can achieve the following effects. The attenuation of the surface wave SW can be suppressed by setting the circumferential length ($\pi \times D2$) of the inner peripheral surface of the dielectric tube 3 as an integral multiple of the constant s, and thereby improving the utilization efficiency of the energy of the surface wave.

Figure 6:
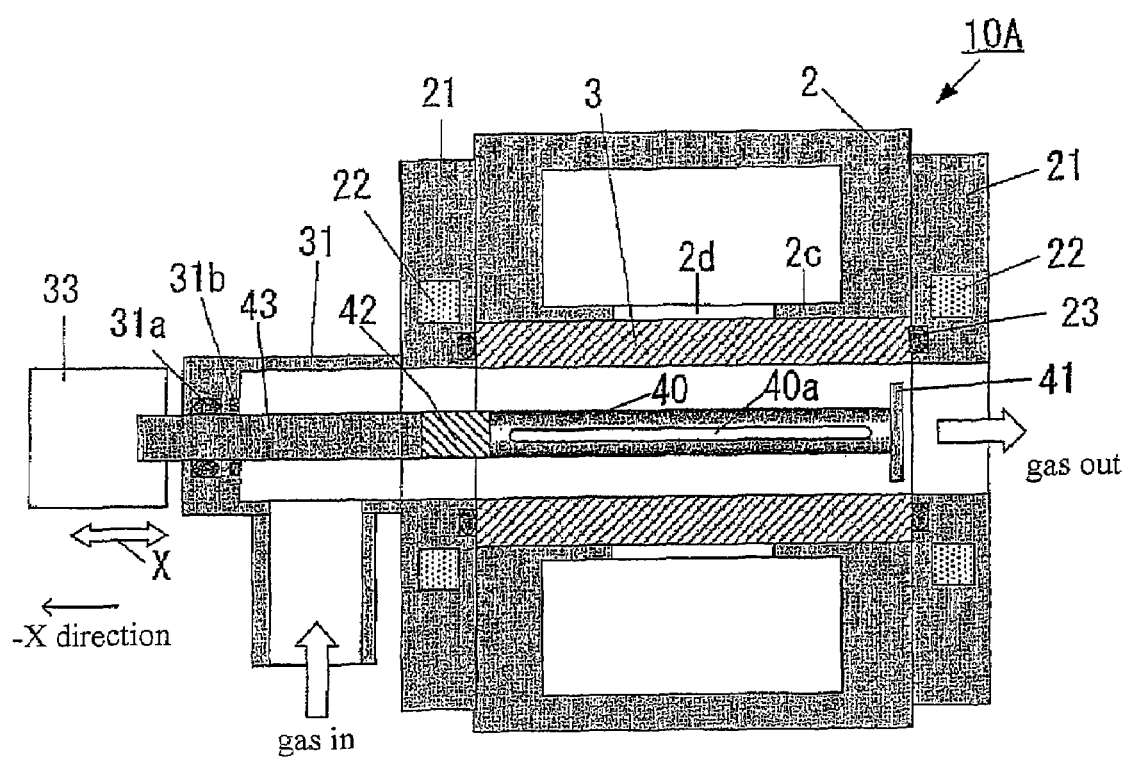
FIG. 6 is a schematic cross-sectional view along the longitudinal direction of the SWP generator according to a varying embodiment of the SWP generator in the first and second embodiments.

FIG. 6 is a schematic longitudinal cross-sectional view of a varying embodiment of the SWP generator 10 according to the first and second embodiments. In the SWP generator 10A of the varying embodiment, besides the structures of the SWP generator 10 in FIGS. 1~3, a movable mechanism 33 is further disposed therein through a flange part 31, which is used for inserting/releasing a carbon rod 40 along the X direction within the inner space of the dielectric tube 3. As the carbon rod 40 can absorb microwaves more effectively, it can be used as a discharging-assistant part to assist the discharging process.

As shown in FIG. 6, a cooling jacket 21 is respectively installed on the right and left end surfaces of the annular waveguide 2. A cooling medium channel 22 is formed on the cooling jacket 21, and the annular waveguide 2 is cooled by the cooling medium flowing in the channel 22. An O-ring seal 23 is installed on the cooling jacket 21 to achieve a sealing effect between the end surface of the dielectric tube 3 and the cooling jacket 21.

The carbon rod 40 has a flat plate 41 on one end part (the right end in FIG. 6) and an insulating part 42 on the other end part, and the insulating part 42 has a rod 43 fastened thereon. The shape and size of the carbon rod 40, the insulating part 42, and the rod 43 are designed to be the same. The movable mechanism 33 is configured in a manner that the carbon rod 40 is inserted into/release from the inner space of the dielectric tube 3 by holding the rod 43 to move back and forth along the X direction. Additionally, a slit-shaped opening 40a is disposed in the carbon rod 40, wherein the slit-shaped opening 40a penetrates through the carbon rod 40 along the longitudinal direction of the carbon rod 40.

The flange part 31 fastened on the cooling jacket 21 at the left side has O-rings 31a, 31b disposed thereon. As shown in FIG. 6, if the carbon rod 40 is disposed within the inner space, the external periphery of the rod 43 is tightly sealed with the O-ring 31a; thus, the inner space of the dielectric tube 3 remains air-tight. Furthermore, if the carbon rod 40 is released from the inner space along the −X direction, the external periphery of the carbon rod 40 is also tightly sealed with the O-ring 31a; thus, the inner space of the dielectric tube 3 remains air-tight. Meanwhile, the front plate 41 of the carbon rod 40 is tightly sealed with the O-ring 31b to serve as a cover. In FIG. 6, predetermined gas is introduced into the inner space from the under side of the flange part 31 and is exhausted from the right end of the inner space.

The surface wave excitation plasma can be easily formed under a pressure in the range of 5-100 Pa. However, if the discharging is required to commence at a pressure higher than the above pressure range, a relative large power is required. Therefore, by means of disposing the carbon rod 40 within the inner space, the discharging can also start at a normal pressure without increasing the power. When the discharging process commences, the current flows around the slit-shaped opening 40a of the carbon rod 40. Accordingly, the discharging process can be more easily started at a normal pressure due to the current flowing around the slit-shaped opening 40a. Once the plasma is formed, even if the carbon rod 40 is released along the X direction by means of the movable mechanism 33, the discharging can also be maintained. Accordingly, the plasma treatment can be performed under a wider range of pressures by utilizing the discharging-assistant part. Besides carbon, the discharging-assistant part may constitute with a material that includes silicon carbide.

As long as the characteristics of the present invention are not compromised, the present invention is not limited to the above embodiments at all. For example, in the SWP generator and the SWP processing apparatus, the circumferential length of the annular waveguide 2 and the positions of the slot antennas 2d can be optimized with respect to the wavelength $\lambda g$ in waveguide and at the same time the circumferential length of the inner surface of the dielectric tube 3 can be optimized with respect to the wavelength $\lambda s$ of the surface wave SW by combining the first and second embodiments.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A surface wave excitation plasma generator, comprising:
a microwave generator;
an annular microwave waveguide, comprising an inlet part for introducing microwave from the microwave generator, a fixed end part, and a bottom plate which serves as an inner surface and comprises one slot antenna formed thereon or a plurality of slot antennas disposed thereon at a predetermined interval; and
a cylinder-shaped dielectric member, having an outer surface being connected to the bottom plate of the annular microwave waveguide, for introducing the microwave propagating in the annular microwave waveguide through the slot antenna, and generating surface wave excitation plasma by utilizing surface wave formed on the surface, wherein
if a wavelength of the microwave in the waveguide is $\lambda g$, and a constant k is in a range of 0.95 $\lambda g$~$\lambda g$, a circumferential length of the inner surface of the bottom plate is set as an integral multiple of the constant k.

2. The surface wave excitation plasma generator as claimed in claim 1, wherein the predetermined interval of the plurality of slot antennas is set as an integral multiple of the constant k.

3. The surface wave excitation plasma generator as claimed in claim 1, wherein a distance between the end part and the slot antenna disposed in front of the end part is set as an integral multiple of ½ of the constant k.

4. A surface wave excitation plasma processing apparatus, comprising:
- the surface wave excitation plasma generator as claimed in claim 1; and
- a treatment chamber, for holding the cylinder-shaped dielectric part to form an air-tight space, and treating a to-be-treated article by utilizing a plasma generated by the surface wave excitation plasma generator.

5. The surface wave excitation plasma generator as claimed in claim 1, wherein a mechanism for inserting/releasing a discharging-assistant part made of carbon or silicon carbide for assisting a discharge is disposed within an inner space of the cylinder-shaped dielectric member.

6. A surface wave excitation plasma generator, comprising:
- a microwave generator;
- an annular microwave waveguide, comprising an inlet part for introducing microwave from the microwave generator, a fixed end part, and a bottom plate which serves as an inner surface and comprises one slot antenna formed thereon or a plurality of slot antennas disposed thereon at a predetermined interval; and
- a cylinder-shaped dielectric member, having an outer surface being connected to the bottom plate of the annular microwave waveguide, for introducing the microwave propagating in the annular microwave waveguide through the slot antenna, and generating surface wave excitation plasma by utilizing surface wave formed on the surface; wherein
- if a wavelength of the surface wave propagating in an inner peripheral surface of the cylinder-shaped dielectric member is $\lambda s$ and a constant s is in a range of $0.95\lambda s \sim \lambda s$, a circumferential length of the inner surface of the cylinder-shaped dielectric member is set as an integral multiple of the constant s.

7. A surface wave excitation plasma processing apparatus, comprising:
- the surface wave excitation plasma generator as claimed in claim 6; and
- a treatment chamber, for holding the cylinder-shaped dielectric part to form an air-tight space, and treating a to-be-treated article by utilizing a plasma generated by the surface wave excitation plasma generator.

8. The surface wave excitation plasma generator as claimed in claim 6, wherein a mechanism for inserting/releasing a discharging-assistant part made of carbon or silicon carbide for assisting a discharge is disposed within an inner space of the cylinder-shaped dielectric member.

* * * * *